(12) United States Patent
Hashimoto (10) Patent No.: US 7,083,999 B2
(45) Date of Patent: Aug. 1, 2006

(54) OPTICAL DEVICE, METHOD OF MANUFACTURING THE SAME, OPTICAL MODULE, CIRCUIT BOARD AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 385 days.

(21) Appl. No.: 10/306,789

(22) Filed: Nov. 27, 2002

(65) Prior Publication Data

US 2003/0123779 A1  Jul. 3, 2003

(30) Foreign Application Priority Data

Dec. 27, 2001  (JP)  ............... 2001-397053

(51) Int. Cl.
*H01L 21/00* (2006.01)

(52) U.S. Cl. .................................. 438/60; 257/440
(58) Field of Classification Search .......... 438/60, 438/64, 113, 116, 460; 257/432, 440, E27.41, 257/E27.15
See application file for complete search history.

(56) References Cited

U.S. PATENT DOCUMENTS

| 6,307,243 | B1 * | 10/2001 | Rhodes ..................... 257/432 |
| 6,483,030 | B1 * | 11/2002 | Glenn et al. ............... 174/52.4 |
| 6,759,723 | B1 * | 7/2004 | Silverbrook ............... 257/433 |
| 2003/0100143 | A1 * | 5/2003 | Mulligan et al. ............ 438/113 |

FOREIGN PATENT DOCUMENTS

| CN | 1276916 | 12/2000 |
| JP | 09-230322 | 9/1997 |
| WO | 99/18612 | 4/1999 |

OTHER PUBLICATIONS

U.S. Appl. No. 10/290,062, filed Nov. 6, 2002.
U.S. Appl. No. 10/292,372, filed Nov. 12, 2002.
U.S. Appl. No. 10/308,877, filed Dec. 3, 2002.

* cited by examiner

*Primary Examiner*—David Vu
(74) *Attorney, Agent, or Firm*—Hogan & Hartson LLP (57) ABSTRACT

A second substrate including a transparent substrate is bonded to a first substrate including a plurality of optical elements each of which has an optical section, with a light transmissive adhesive layer interposed, to seal the optical sections. The first substrate is then cut into the individual optical elements.

12 Claims, 10 Drawing Sheets

OPTICAL DEVICE, METHOD OF MANUFACTURING THE SAME, OPTICAL MODULE, CIRCUIT BOARD AND ELECTRONIC INSTRUMENT

Japanese Patent Application No. 2001-397053, filed on Dec. 27, 2001, is herein incorporated by reference in its entirety.

BACKGROUND OF THE INVENTION

The present invention relates to an optical device, a method of manufacturing the same, an optical module, a circuit board and an electronic instrument.

The optical element, having an optical section like a light-receiving section, preferably has a space provided between an optical section and a cover sealing the optical section. For this reason, there is known a method of manufacturing an optical device that, after fragmented into an optical element, a space is provided between an optical section and a cover in order to seal the optical section by the cover. Fragmentation is made by cutting a substrate, such as a wafer. In such a case, dust such as cutting chips occur. In case sealing is done with such dust put on the optical section, the dust in the later cannot be removed out of the space, resulting in a problem of lower in the optical device quality. In particular, in the case of a solid-state imaging device having an optical section with microlenses, the microlenses having concave/convex surfaces is ready to put dust thereon. There is difficulty in perfectly removing such dust. Consequently, when the optical device has an optical section with microlenses, there is a problem that the quality of the optical device (or solid-state imaging device) is more likely to be degraded.

BRIEF SUMMARY OF THE INVENTION

According to one aspect of the present invention, there is provided a method of manufacturing an optical device comprising the steps of:

(a) bonding a second substrate including a transparent substrate to a first substrate including a plurality of optical elements each of which has an optical section, with a light transmissive adhesive layer interposed, to seal the optical sections; and (b) cutting the first substrate into the individual optical elements.

An optical device according to another aspect of the present invention is manufactured by the above method.

An optical module according to further aspect of the present invention comprises:

the above optical device; and a support member to which the optical device is attached.

According to still another aspect of the present invention, there is provided a circuit board to which is mounted the above optical module.

An electronic instrument according to still further aspect of the present invention comprises the above optical module.

DETAILED DESCRIPTION OF THE EMBODIMENT

These embodiments of the present invention may provide an optical device having high quality and a method of manufacturing such optical device, an optical module, a circuit board and an electronic instrument.

(1) According to one embodiment of the present invention, there is provided a method of manufacturing an optical device comprising the steps of:

(a) bonding a second substrate including a transparent substrate to a first substrate including a plurality of optical elements each of which has an optical section, with a light transmissive adhesive layer interposed, to seal the optical sections; and (b) cutting the first substrate into the individual optical elements.

According to this embodiment, because the first substrate is cut after sealing the optical sections, an optical device having high quality can be obtained without dust within the sealed region.

(2) In this method of manufacturing an optical device, in the step (a), the second substrate on which a plurality of the transparent substrates are fixedly disposed may be bonded to the first substrate.

Since the second substrate previously has a plurality of transparent substrates, it is not necessary to cut the second substrate after it is bonded to the first substrate. Also, the transparent substrates are fixedly disposed so that they can be easily bonded to the first substrate.

(3) In this method of manufacturing an optical device, the second substrate may be obtained by bonding a light transmissive plate to a sheet and cutting the plate into a plurality of the transparent substrates without cutting the sheet, to provide a substrate including the sheet and the transparent substrates bonded to the sheet.

(4) In this method of manufacturing an optical device, the adhesive layer may be provided on the transparent substrate before the second substrate is bonded to the first substrate.

This makes it possible to provide no adhesive layer in regions having no transparent substrates in the first substrate.

(5) In this method of manufacturing an optical device, each of the optical elements of the first substrate may have electrodes formed outside the optical section; and in the step (a), the transparent substrate maybe provided above the first substrate except above the electrodes.

Since the space above the electrodes in the first substrate is opened, electrical connection is easily made to the electrodes.

(6) In this method of manufacturing an optical device, the step (a) may include:

($a_1$) bonding the second substrate to the first substrate; and ($a_2$) cutting the second substrate into a plurality of the transparent substrates such that the transparent substrates respectively face the optical sections.

This makes the positioning of the second substrate and the first substrate easier. Moreover there is no need to align individual elements.

(7) In this method of manufacturing an optical device, each of the optical elements of the first substrate may have electrodes outside the optical section; and in the step ($a_2$), part of the second substrate facing the electrodes may be removed when cutting the second substrate.

Since the space above the electrodes in the first substrate is opened, electrical connection is easily made to the electrodes.

(8) In this method of manufacturing an optical device, a cutter used to cut the second substrate in the step ($a_2$) may have a width larger than a width of a cutter used to cut the first substrate in the step (b).

(9) In this method of manufacturing an optical device, the step (a) may include:

($a_1$) forming the adhesive layer on the first substrate; and ($a_2$) bonding a plurality of the second substrates to the respective optical sections of the optical elements.

In such a case that there is a great difference in thermal expansion coefficient or the like between the first substrate and the second substrate, the second substrate having fragmented transparent substrates can be bonded with positional accuracy to the optical sections.

(10) In this method of manufacturing an optical device, each of the optical elements of the first substrate may have electrodes outside the optical sections; and in the step ($a_2$), the second substrates may be disposed above the first substrate except above the electrodes.

Since the space above the electrodes in the first substrate is opened, electrical connection is easily made to the electrodes.

(11) In this method of manufacturing an optical device, the step (a) may include providing the adhesive layer continuously over the optical elements.

(12) In this method of manufacturing an optical device, in the step (a), the adhesive layer may be continuously provided over the optical elements; and at least part of the adhesive layer facing the electrodes may be removed to expose the electrodes, after the step (a).

(13) In this method of manufacturing an optical device, in the step (a), the adhesive layer may be provided above each of the optical elements except above the electrodes.

(14) In this method of manufacturing an optical device, the transparent substrate may allow visible light to transmit but block infrared light.

(15) In this method of manufacturing an optical device, the first substrate may be a semiconductor wafer.

(16) In this method of manufacturing an optical device, the optical section may have a plurality of light-receiving sections provided for image sensing.

(17) In this method of manufacturing an optical device, the optical section may have a color filter provided above the light-receiving sections.

(18) In this method of manufacturing an optical device, the optical section may have a microlens array provided on a surface of the first substrate.

(19) In this method of manufacturing an optical device, a material which is different from the microlens array in absolute refractive index may be used as a material of the adhesive layer.

(20) An optical device according to one embodiment of the present invention is manufactured by the above-described method.

(21) An optical module according to one embodiment of the present invention comprises:

the above optical device; and a support member to which the optical device is attached.

(22) According to one embodiment of the present invention, there is provided a circuit board to which is mounted the above optical module.

(23) An electronic instrument according to one embodiment of the present invention comprises the above optical module.

Embodiments of the present invention will now be described with reference to the drawings.

FIRST EMBODIMENT

Figure 1A:
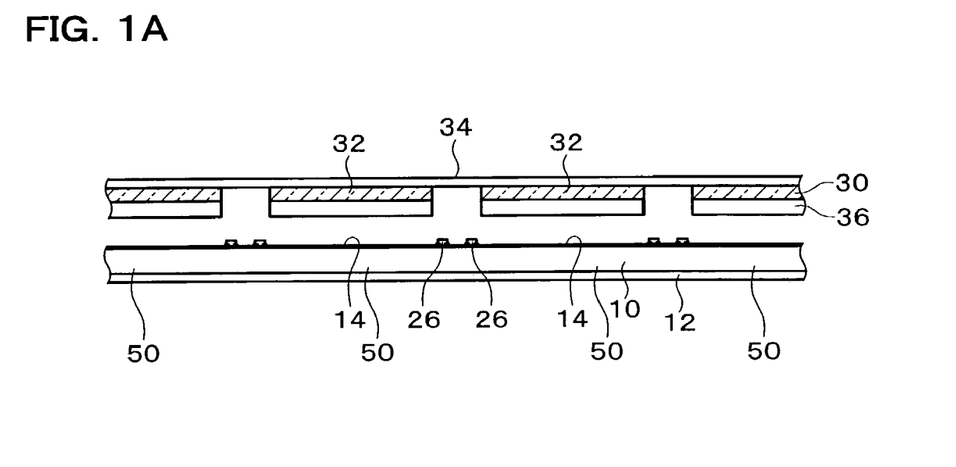
FIGS. 1A and 1B are views for describing a method of manufacturing an optical device according to a first embodiment of the present invention.
Figure 1B:
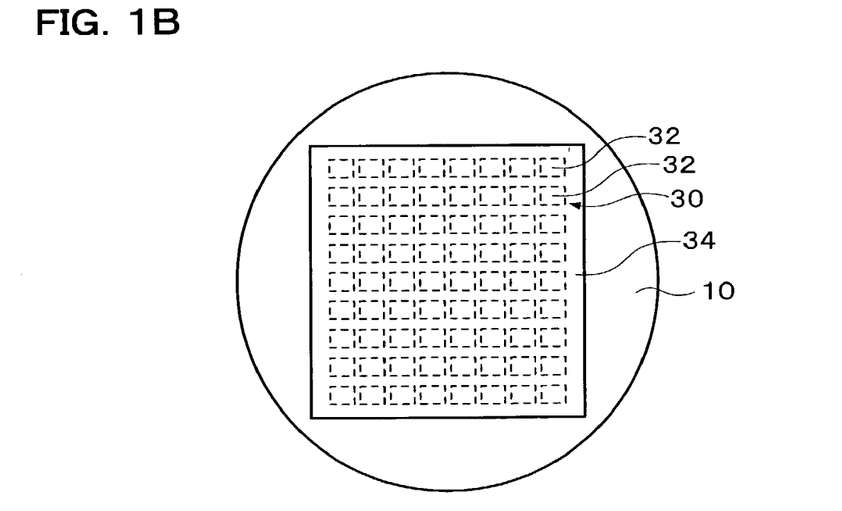

FIGS. 1A to 5B are views for describing an optical device and a method of manufacturing that optical device according to a first embodiment of the present invention. In this embodiment, a second substrate 30a is attached to a first substrate 10, as shown in FIGS. 1A and 1B.

Figure 2:
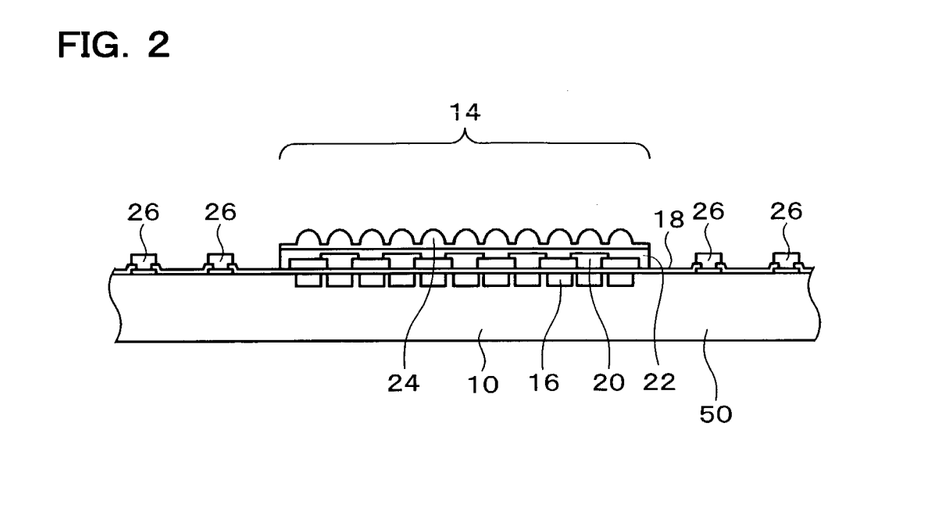
FIG. 2 is a view for describing the method of manufacturing an optical device according to the first embodiment of the invention.

The first substrate 10 may be bonded with a sheet 12 in order to improve the operationality in the cutting process to be described later. FIG. 2 is an enlarged view showing part of the first substrate 10. The first substrate 10 has a plurality of optical elements 50 each including an optical section 14. The optical element 50 includes an optical section 14 and electrodes 26. The optical section 14 is a part through which light is allowed to enter and exit. The optical section 14 carries out conversion between optical energy and other energy (e.g. electricity). Namely, one optical section 14 has a plurality of energy conversion sections (light-receiving sections and light-emitting sections) 16.

In this embodiment, the optical section 14 has a plurality of energy conversion sections (light-emitting section or image sensor portions) 16. As shown in FIG. 2, the plurality of energy conversion sections 16 are arranged in two dimensions in order for image sensing. Namely, an optical device or module, to be manufactured by the present embodiment, is a solid-state imaging device, such as an image sensor (e.g. CCD, CMOS sensor). The energy conversion sections 16 are covered by a passivation film 18. The passivation film 18 possesses light transmissivity. Provided that the first substrate 10 includes a semiconductor substrate (e.g. semiconductor wafer), the passivation film 18 may be formed of $SiO_2$ or SiN.

The optical section 14 may have a color filter 20. The color filter 20 is formed on the passivation film 18. Meanwhile, a planarizing layer 22 may be provided over the color filters 20 to provide a microlens array 24 thereon.

A plurality of electrodes 26 are formed on the first substrate 10. Each of the electrodes 26, shown in FIG. 2, has a bump formed on a pad, but may have solely the pad. As shown in FIG. 2, the electrodes 26 in each optical element 50 are preferably formed on an outer side of the optical section 14. For example, the electrodes 26 are formed between the adjacent ones of optical sections 14. One optical section 14 corresponds to one group of electrodes 26. For example, the electrodes 26 may be arranged along a plurality of sides (e.g. opposite two sides) of the optical section 14, as shown in FIG. 5B.

The second substrate 30 includes transparent substrates 32. The transparent substrate 32 possesses light transmissivity. The transparent substrate 32 is, for example, in a shape of quadrilateral, though not especially limited. Meanwhile, the second substrate 30 may have an outer shape nearly the same as an outer shape of the first substrate 10. The transparent substrate 32 is arranged over the optical section 14. The transparent substrate 32, if transmissive to light, is regardless of loss degree or may allow transmission of a particular wavelength of light. The transparent substrate 32 may allow transmission of visible light but blocks infrared light from transmitting. The transparent substrate 32 may be low in loss for visible light but high in loss against infrared light. Meanwhile, the transparent substrate 32 may have a film through which visible light is allowed to transmit but infrared light is blocked from transmitting. The transparent substrate 32 may use an optical glass or a plastic plate.

The second substrate 30 is bonded to the first substrate 10 through an adhesive layer 36. In this embodiment, an adhesive layer 36 is provided on the transparent substrate 32. The adhesive layer 36 has light transmissivity. Particularly, the light transmissivity of the adhesive layer 36 may be high nearly equivalent to the light transmissivity of the air. The adhesive layer 36 may use a thermoplastic resin. For example, a thermoplastic photosensitive resin (e.g. photoresist) may be used. The adhesive layer 36 may be once, temporarily cured for easy handling, so that it can exhibit an adhesive force after placed into contact with the first substrate 10. For example, provided that the adhesive layer 36 is a UV-set thermoplastic resin, UV-ray radiation can be applied in temporary cure. In the case the adhesive layer 36 is formed on the microlens array 24, there is a difference in absolute refractive index between the both. Specifically, in case the microlens array 24 has convex lenses as shown in FIG. 2, the absolute refractive index of the adhesive layer 36 is preferably smaller than the absolute refractive index of the microlens array 24. Conversely, in case the microlens array 24 has concave lenses, the absolute refractive index of the adhesive layer 36 is preferably greater than the absolute refractive index of the microlens array 24.

The transparent substrates 32 may be bonded one by one onto the first substrate 10. In this embodiment, a plurality of transparent substrate 32 in a state fixed in relative position are bonded to the first substrate 10. In the example shown in FIGS. 1A and 1B, a plurality of transparent substrates 32 are previously bonded to a sheet 34. This allows to bond the plurality of transparent substrates 32 at one time. Note that the plurality of transparent substrates 32 may be arranged in a matrix form.

Figure 3A:
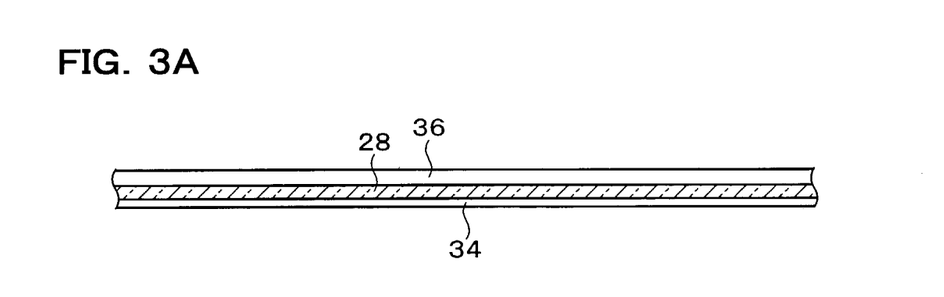
FIGS. 3A and 3B are views for describing the method of manufacturing an optical device according to the first embodiment of the invention.
Figure 3B:
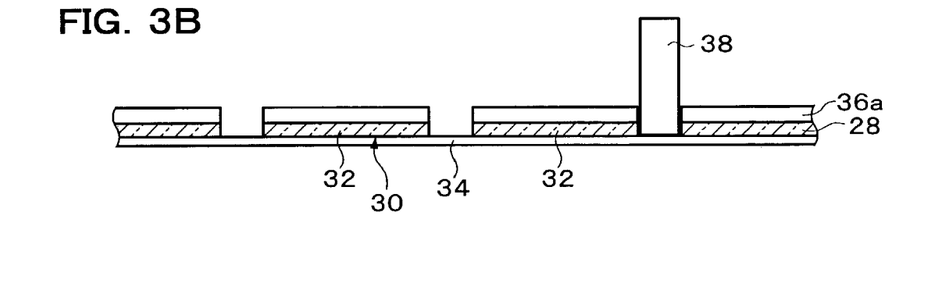

FIGS. 3A and 3B are views for describing a step of obtaining a second substrate including a plurality of fixedly disposed transparent substrates. In this example, a plate 28 is bonded to a sheet 34 to form an adhesive layer 36 on the plate 28, as shown in FIG. 3A. Incidentally, the adhesive layer 36 may be temporarily cured. Then, by a cutter 38 (e.g. dicing blade), the plate 28 is cut into a plurality of transparent substrates 32 in a manner not to cut the sheet 34, as shown in FIG. 3B. At this time, the adhesive layer 36 is also cut (individual ones of the cut adhesive layer are shown by reference 36a). The spacing between the adjacent transparent substrates 32 is determined depending on a width (or thickness) of the cutter 38. Namely, the regions of plate 28 along cutting lines are removed depending on a width (or thickness) of the cutter 38. The width of the cutter 38 may be greater than a width of a cutter for cutting the first substrate 10, to be referred later.

In this manner, transparent substrates 32 are obtained from the plate 28. Namely, obtained is a second substrate including the sheet 34 and the transparent substrates 32 bonded to the sheet 34. Due to this, because the plate 28 after forming the adhesive layer 36 is cut, there is less adhesion of the adhesion layer 36 to the end faces of the transparent substrates 32. Incidentally, as a modification, after cutting the plate 28 bonded to the sheet 34 into a plurality of transparent substrates 32, an adhesive layer 36 may be provided on the plurality of transparent substrates 32. Otherwise, an adhesive layer 36 may be formed on the plate 28 in a form of transparent substrate 32 (avoiding cutting lines) to cut the plate 28 at a region the adhesive layer 36 is not formed.

Figure 4A:
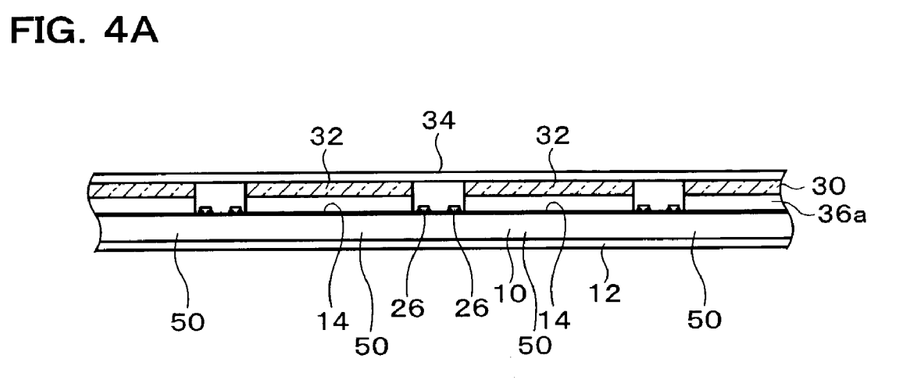
FIGS. 4A and 4B are views for describing the method of manufacturing an optical device according to the first embodiment of the invention.

As shown in FIG. 4A, the second substrate 30 is attached on the first substrate 10 through the above process. The first substrate 10 includes a plurality of optical elements 50 each having an optical section 14. The transparent substrates 32 are respectively arranged in positions above the optical sections 14. Meanwhile, the transparent substrates 32 are provided avoiding the electrodes 26. In the case the adhesive layer 36 is temporarily cured, it is, for example, heated to exhibit an adhesion force. If necessary, stripped is the sheet 34 of second substrate 30 bonded to the transparent substrates 32. The adhesive layer 36 and the transparent substrate 32 seal the optical section 14. No gap may be provided between the adhesive layer 36 and the optical region 14. If part of the adhesive layer 36 is adhered to the electrode 26, a step of removing the adhered part may be added. The adhered portion of the adhesive layer 36 can be removed by a solvent, etching with sputtering or ashing with exposure to a plasma (e.g. $O_2$ plasma). Meanwhile, it is preferred to provide a process to clean the optical sections 14 immediately before sealing the optical sections 14. In this case, the optical section 14 can be prevented from being sealed with dust and fuzz being put on the optical sections 14, improving the yield of optical devices.

Figure 4B:
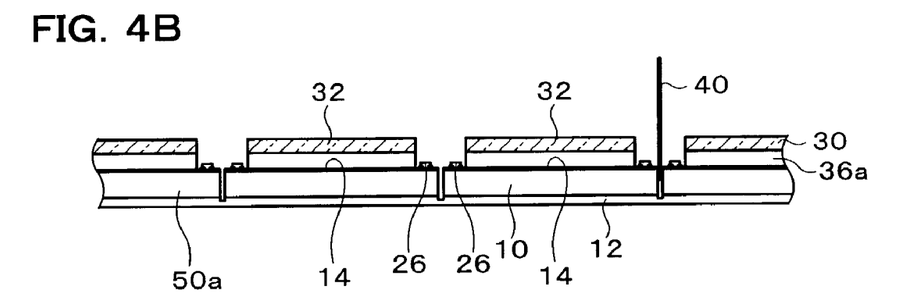

As shown in FIG. 4B, the first substrate 10 is cut into individual optical elements 50a. In the cutting, a cutter 40 (e.g. dicing blade) is used. The first substrate 10 is cut at an outside of the optical section 14 and further an outside of the electrode 26. In the example shown in FIG. 4B, between the adjacent optical sections 14, formed are electrodes 26 that correspond respectively to the optical sections 14. Cutting the first substrate 10 at between these electrodes 26 (in plurality) provides individual optical elements 50a. In case a sheet 12 is bonded to the first substrate 10, when the first substrate 10 is fragmented into the optical elements 50a, the optical elements 50a are not placed into irregular separation. In this manner, optical devices are obtained. According to this embodiment, because the first substrate 10 is cut after sealing the optical sections 14, it is possible to obtain a quality optical device without encountering dust intrusion to the sealed region.

Figure 5A:
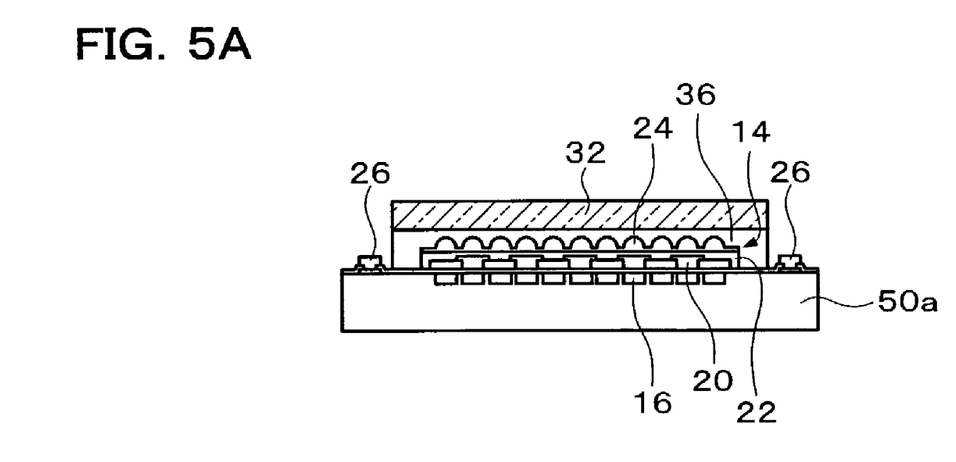
FIGS. 5A and 5B are views for describing an optical device according to the first embodiment of the invention.
Figure 5B:
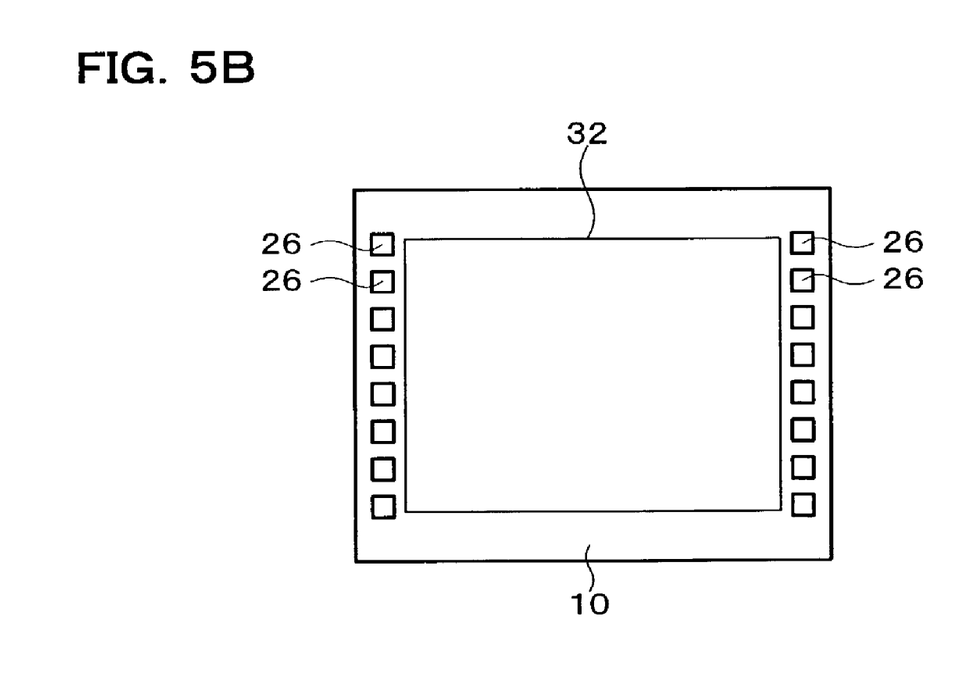

FIG. 5A is a vertical sectional view for describing an optical device according to the first embodiment of the invention, while FIG. 5B is a plan view thereof. The optical device has an optical element 50a and a transparent substrate 32. Light enters to the optical section 14 through the transparent substrate 32. The optical section 14 provided on the optical element 50a is sealed by an adhesive layer 36 and transparent substrate 32. The microlens array 24 and the adhesive layer 36 formed thereon are different in absolute refractive index. Specifically, provided that the microlens array 24 has convex lenses as viewed from the adhesive layer 36, the absolute refractive index of the adhesive layer 36 is preferably smaller than the absolute refractive index of the microlens array 24. Conversely, in case the microlens array 24 has concave lenses as viewed from the adhesive layer 36, the absolute refractive index of the adhesive layer 36 is preferably greater than the absolute refractive index of the microlens array 24. Electrodes 26 are provided on the first substrate 10 (specifically, optical element 50a as a piece thereof) in positions outer side of the optical section 14 and further of the transparent substrate 32. The description, made in the method of manufacturing an optical device, is true for the detail in the other respects.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

SECOND EMBODIMENT

Figure 6A:
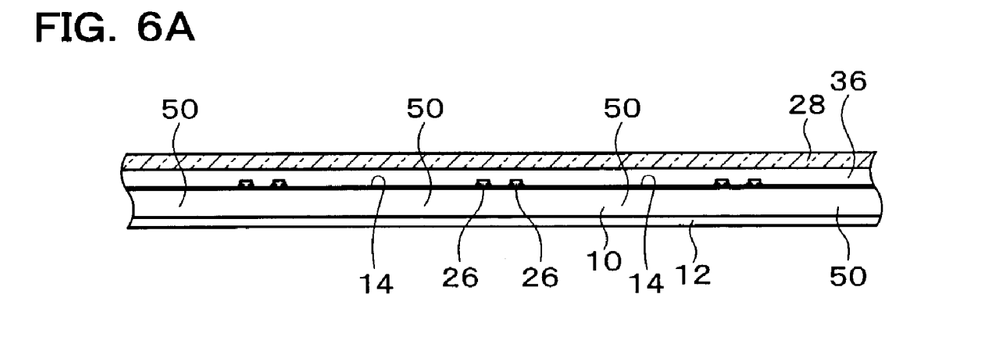
FIGS. 6A to 6C are views for describing a method of manufacturing an optical device according to a second embodiment of the invention.
Figure 6B:
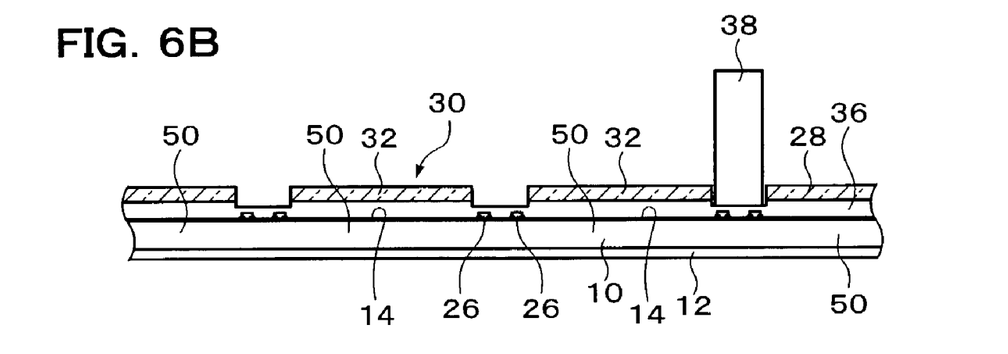
Figure 6C:
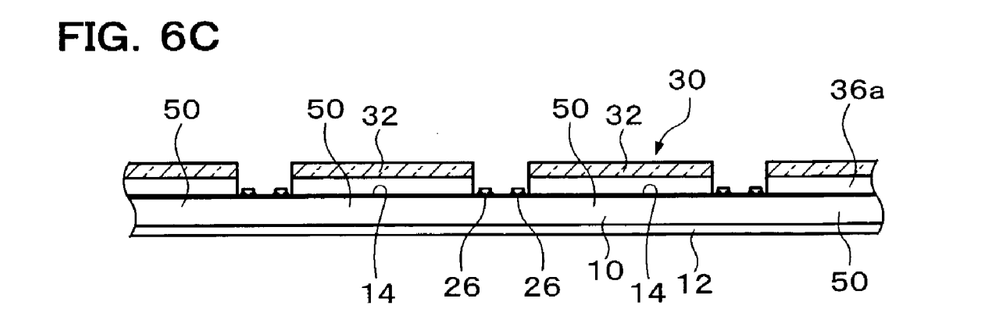

FIGS. 6A to 6C are views for describing a method of manufacturing an optical device according to a second embodiment of the invention. This embodiment uses the members described in the first embodiment.

As shown in FIG. 6A, the second substrate 30 is bonded to the first substrate 10 through an adhesive layer 36. The adhesive layer 36 may be formed in a continuous form over the plurality of optical elements 50 on the first substrate 10. Namely, the adhesive layer 36 may be formed in a manner covering the plurality of optical sections 14 and the regions between the adjacent ones of optical sections 14. In such a case, the adhesive layer 36 can be formed by a simple way. As a modification, the adhesive layer 36 may be formed over the optical sections 14 avoiding the regions between the adjacent optical sections 14.

As shown in FIG. 6B, the second substrate 30 is cut to form a plurality of transparent substrates 32. The second substrate 30 is cut correspondingly to the optical sections 14. The cutting line on the second substrate 30 is preferably in a position above the electrodes 26 of the first substrate 10. Namely, the region of the second substrate 30 at above the electrodes 26 is removed in order to readily provide electrical connection to the electrodes 26. For example, a cutting tool is used as a cutter 38 to cut the second substrate 30. In this manner, the electrodes 26 is made open at the above thereof. Incidentally, the cutter 38 (e.g. dicing blade) preferably has a width greater than that of the cutter 40 (see FIG. 4B) for cutting the first substrate 10. Cutting the second substrate 30 is made in a manner not to damage the surface of the second substrate 30 and the electrodes 26. For example, the cutter 38 is controlled to cut only an upper portion of the adhesive layer 36 in order not to place the tip of the cutter 38 into contact with the electrode 26. Grooves, not shown, maybe formed in the second substrate 30. In such a case, the grooves are arranged directed to the electrodes 26. By doing so, the surface of the second substrate 30 is distant by an amount of a groove depth from the electrode 26. Hence, the tip of the cutter 38 is placed not to be readily contacted with the electrode 26.

As shown in FIG. 6B, when part of the adhesive layer 36 is left between the adjacent ones of transparent substrates 32 (e.g. over the electrode 26), a step of removing it is performed. For example, the part of the adhesive layer 36 can be removed by etching with a solvent or sputtering, or plasma ($O_2$ plasma or the like) ashing, with the transparent substrates 32 as a mask.

In this manner, the optical sections 14 can be sealed as shown in FIG. 6C. Thereafter, a process shown in FIG. 4B is carried out. According to this embodiment, the transparent substrates 32 can be formed in a simple way. Also, there is no need to align a plurality of transparent substrates in irregular separation. In the other respects, the description in the first embodiment is true for this embodiment.

THIRD EMBODIMENT

Figure 7A:
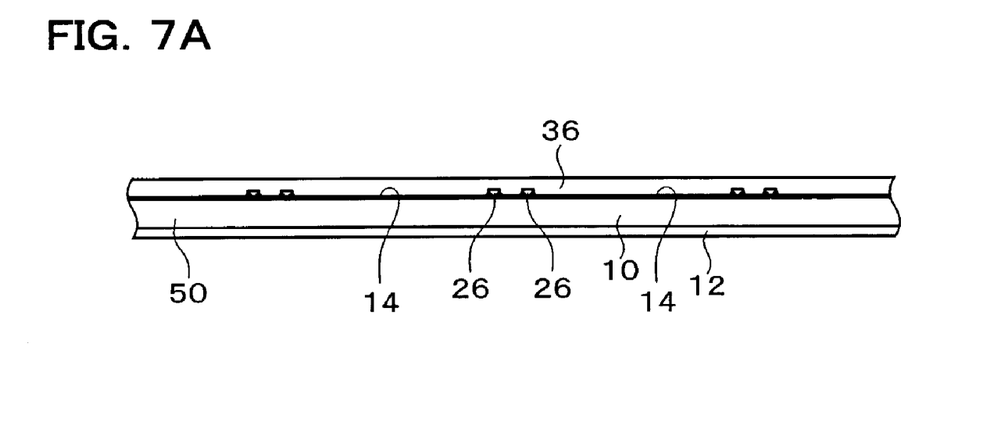
FIGS. 7A and 7B are views for describing a method of manufacturing an optical device according to a third embodiment of the invention.
Figure 7B:
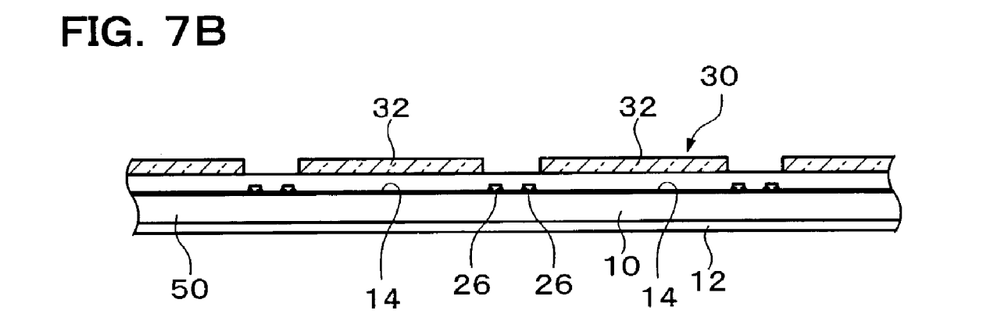

FIGS. 7A and 7B are views for describing a manufacturing method of an optical device according to a third embodiment of the invention. This embodiment uses the members described in the first embodiment.

As shown in FIG. 7A, this embodiment includes an adhesive layer 36 formed over the first substrate 10. Description for it is as shown in the second embodiment. Then, a plurality of transparent substrates 32 are bonded, as a plurality of second substrates 30, onto the adhesive layer 36 as shown in FIG. 7B. Specifically, the transparent substrates 32 are respectively arranged above the optical sections 14 and then bonded to the adhesive layer 36. Meanwhile, the transparent substrates 32 are preferably arranged avoiding the electrodes 26.

In this manner, the second substrates 30, previously turned into the plurality of transparent substrates 32, may be bonded to the first substrate 10. In the other respects, the description made in the first or second embodiment is true for this embodiment.

FOURTH EMBODIMENT

Figure 8:
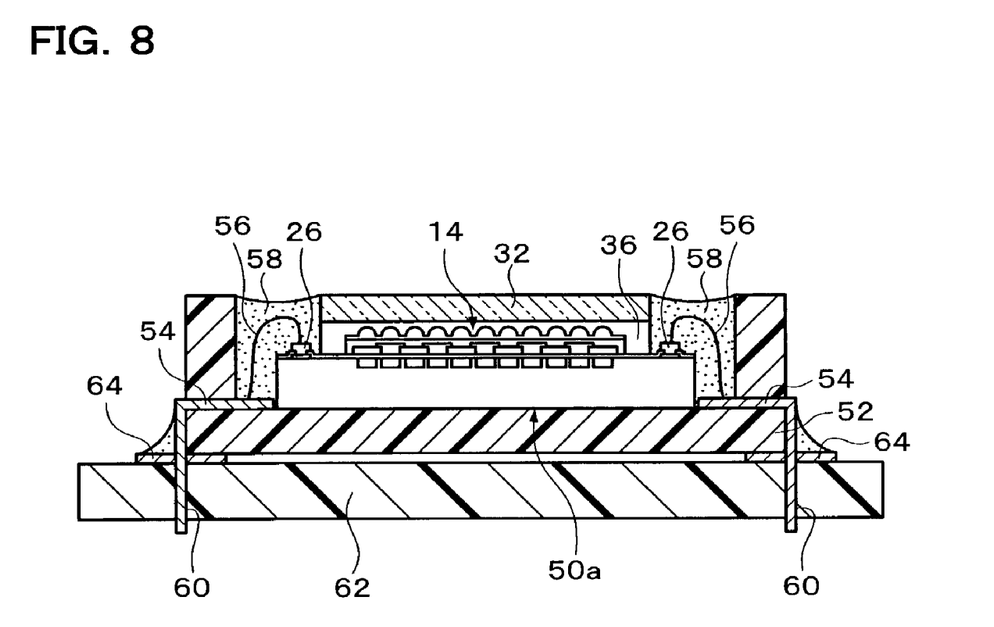
FIG. 8 is a view for describing an optical module and a circuit board according to a fourth embodiment of the invention.

FIG. 8 is a view for describing an optical module and circuit board according to a fourth embodiment of the invention. The optical module shown in FIG. 8 has the optical element 50a shown in FIG. 5A. The optical element 50a is attached on a support member (e.g. case) 52. The support member 52 is provided with a wiring 54. The support member 52 maybe an molded interconnect device (MID). Electrical connection is provided between the electrode 26 of the optical element 50a and the wiring 54. Wires 56, for example, may be employed in the electrical connection. Meanwhile, a seal material 58 is provided in an electrical connecting region (e.g. wire 56 and region bonded therewith). Namely, the electrical connecting region is sealed by the sealing material 58. The sealing material 58 maybe provided by potting, for example. In the optical element 50a, the optical section 14 is sealed by the transparent substrate 32 and adhesive layer 36. Consequently, the transparent substrate 32 and adhesive layer 36 serves as a dam and hence the sealing material 58 does not cover the optical section 14.

The wiring 54 has a part made as an external terminal (e.g. lead) 60. The external terminal 60 is electrically connected to an interconnect pattern 64 formed on the circuit board 62. In the example shown in FIG. 8, the circuit board 62 has a hole into which the external terminal 60 is inserted. A land of the interconnect pattern 64 is formed around the hole. The land and the external terminal 60 are joined together by solder or brazing alloy. In this manner, the circuit board 62 is mounted with an optical module. Meanwhile, the support member 52 may be nothing but the circuit board 62 not having an external terminal 60.

OTHER EMBODIMENTS

Figure 9:
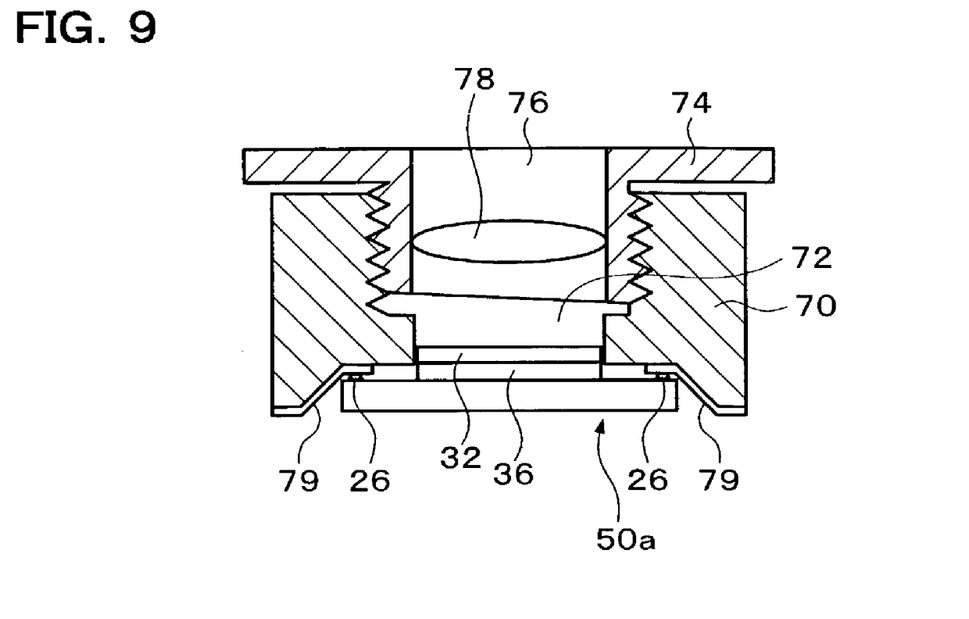
FIG. 9 is a view showing an optical module according to one embodiment of the invention.

FIG. 9 is a view for describing an optical module according to one embodiment of the invention. The optical module shown in FIG. 9 has an optical element 50a shown in FIG. 5A and a support member 70 attached with the optical element 50a. The support member 70 has a hole 72, and at least part of the transparent substrate 32 is positioned inside the hole 72. Also, a lens holder 74 is provided in the hole 72. The lens holder 74 has a hole 76 in which a lens 78 is provided. The holes 76, 72 are in mutual communication, allowing the light focused by the lens 78 to enter the transparent substrate 32. Incidentally, the transparent substrate 32 may be to cut off infrared light. The connection of between the electrode 26 of the optical element 50a and the wiring 79 of the support member 70 may apply any of adhesive, anisotropic conductive material, anisotropic conductive film and metal junction. Also, an under-fill material, not shown, may be provided at between the optical element 50a and the support member 70.

Figure 10:
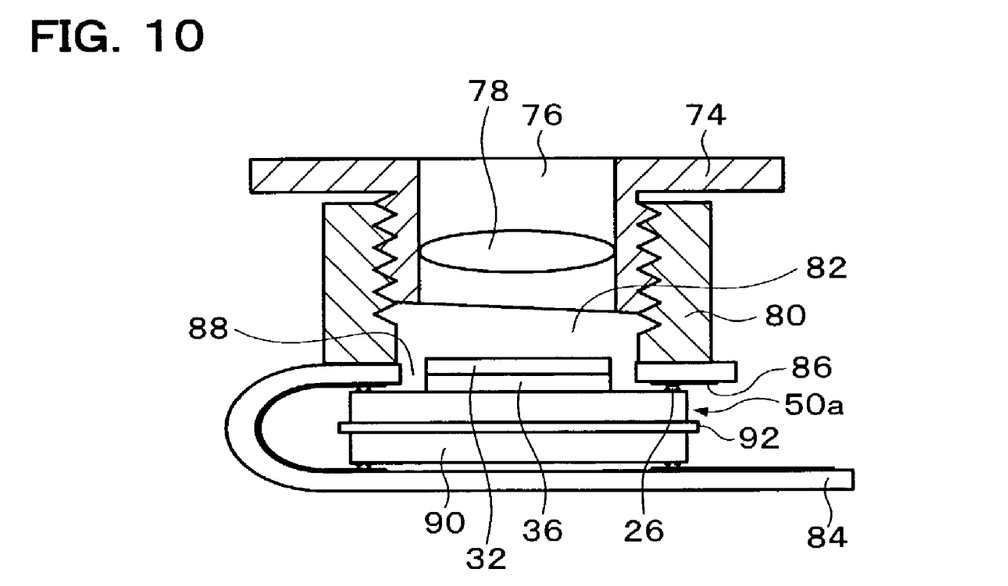
FIG. 10 is a view showing an optical module according to one embodiment of the invention.

FIG. 10 is a view showing an optical module according to one embodiment of the invention. The optical module shown in FIG. 10 has an optical element 50a shown in FIG. 5A and a support member 80 attached with the optical element 50a. The support member 80 has a hole 82 and at least part of the transparent substrate 32 is positioned inside the hole 82. Also, a lens holder 74 is provided in the hole 82 (already detailed in the above).

In FIG. 10, the optical element 50a is mounted on a flexible board 84, wherein connection is made between the electrode 26 and the interconnect pattern 86 formed on the flexible board 84. The connection may apply any of adhesive, anisotropic conductive material, anisotropic conductive film and metal junction. Also, an under-fill material, not shown, may be provided at between the optical element 50a and the flexible board 84. The flexible board 84 also has a hole 88. The holes 76, 82, 88 are mutually communicated, allowing the light focused by the lens 78 to enter the optical element 50a.

An electronic component (e.g. semiconductor chip) 90 is mounted (e.g. bonded faced down) on the flexible board 84. The electronic component 90 and the interconnect pattern 86 are electrically connected together. By folding the flexible board 84, the electronic component 90 and the optical device 50 are bonded together through an adhesive 92. Incidentally, the optical element 50a and the electronic component 90 may be previously mounted on the flexible board 84 and then the flexible board 84 be folded to bond the optical element 50a and the electronic component 90 together.

Figure 11:
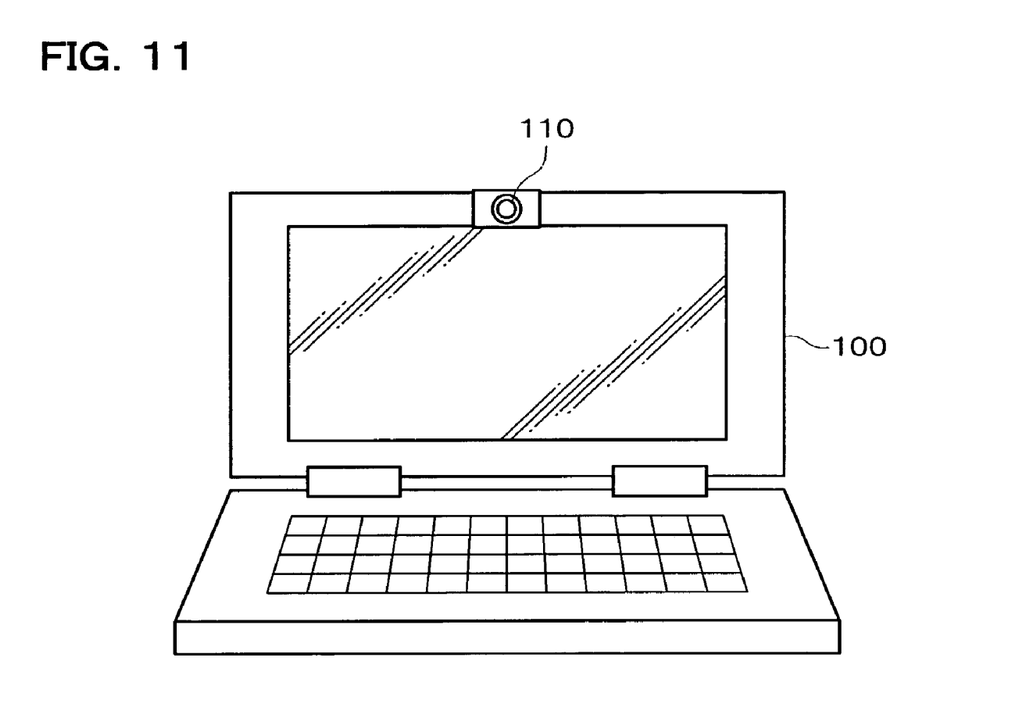
FIG. 11 is a view showing an electronic instrument according to one embodiment of the invention.
Figure 12:
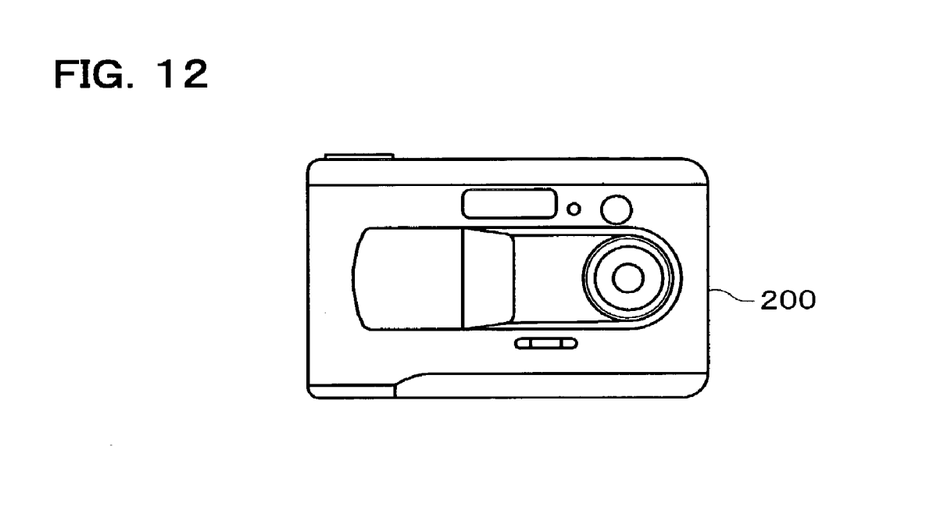
FIG. 12 is a view showing an electronic instrument according to one embodiment of the invention.
Figure 13A:
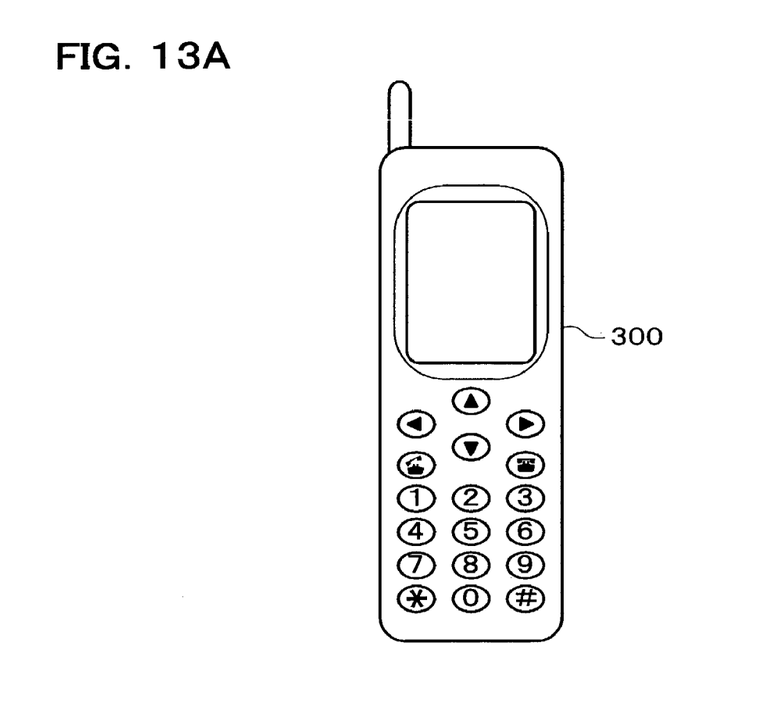
FIGS. 13A and 13B are views showing an electronic instrument according to one embodiment of the invention.
Figure 13B:
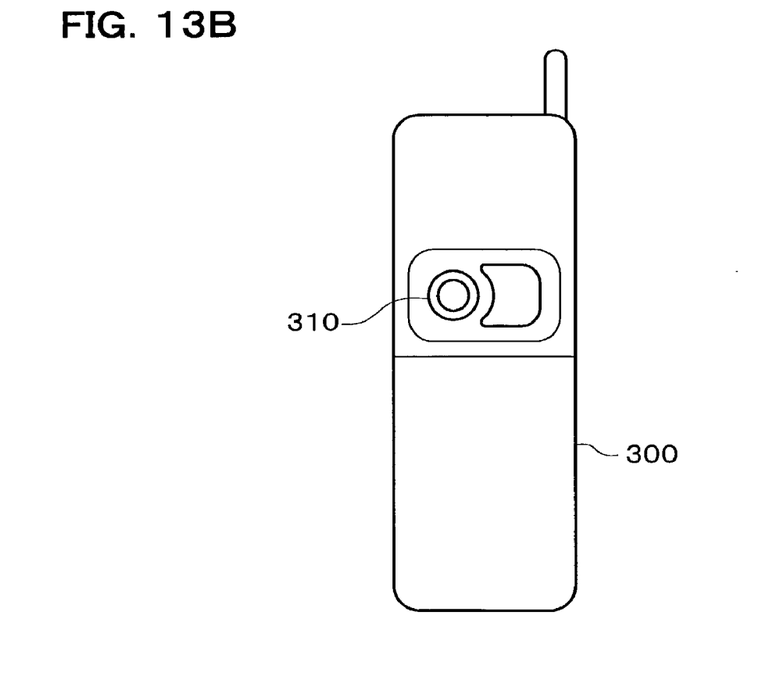

As an electronic instrument according to the embodiment of the invention, a notebook computer 100 shown in FIG. 11 has a camera 110 incorporating therein the optical module. Meanwhile, the digital camera 200 shown in FIG. 12 has the optical module. Furthermore, the cellular phone 300 shown in FIGS. 13A and 13B has a camera 310 incorporating therein the optical module.

What is claimed is:

1. A method of manufacturing an optical device comprising:
   (a) bonding a second substrate including a transparent substrates to a first substrate including a plurality of optical elements each of which has an optical section, with a light transmissive adhesive layer interposed, to seal the optical sections, each of the optical elements having electrodes outside the optical section;
   (b) cutting the second substrate into the transparent substrates such that the transparent substrates respectively face the optical sections, by removing part of the second substrate facing the electrode to expose the electrodes, and
   (c) cutting the first substrate into the individual optical elements.

2. The method of manufacturing an optical device as defined in claim 1, wherein:
   the adhesive layer is provided on the transparent substrate before the second substrate is bonded to the first substrate.

3. The method of manufacturing an optical device as defined in claim 1, wherein:
   the step (a) includes providing the adhesive layer continuously over the optical elements.

4. The method of manufacturing an optical device as defined in claim 1, wherein:
   in the step (a), the adhesive layer is continuously provided over the optical elements; and
   at least part of the adhesive layer facing the electrodes is removed to expose the electrodes, after the step (a).

5. The method of manufacturing an optical device as defined in claim 1, wherein:
   in the step (a), the adhesive layer is provided above each of the optical elements except above the electrodes.

6. The method of manufacturing an optical device as defined in claim 1,
   wherein the transparent substrate allows visible light to transmit but blocks infrared light.

7. The method of manufacturing an optical device as defined in claim 1,
   wherein the first substrate is a semiconductor wafer.

8. The method of manufacturing an optical device as defined in claim 1,
   wherein the optical section has a plurality of light-receiving sections provided for image sensing.

9. The method of manufacturing an optical device as defined in claim 8,
   wherein the optical section has a color filter provided above the light-receiving sections.

10. The method of manufacturing an optical device as defined in claim 8,
    wherein the optical section has a microlens array provided on a surface of the first substrate.

11. The method of manufacturing an optical device as defined in claim 10, wherein a material which is different from the microlens array in absolute refractive index is used as a material of the adhesive layer.

12. The method of manufacturing an optical device as defined in claim 1, wherein a cutter used to cut the second substrate in the step (b) has a width larger than a width of a cutter used to cut the first substrate in the step (c).

* * * * *